United States Patent [19]
Esch, Jr.

[11] Patent Number: 6,118,310
[45] Date of Patent: Sep. 12, 2000

[54] DIGITALLY CONTROLLED OUTPUT DRIVER AND METHOD FOR IMPEDANCE MATCHING

[75] Inventor: Gerald L. Esch, Jr., Ft. Collins, Colo.

[73] Assignee: Agilent Technologies, Palo Alto, Calif.

[21] Appl. No.: 09/186,006

[22] Filed: Nov. 4, 1998

[51] Int. Cl.[7] .......................... H03K 3/01; H03K 19/0175
[52] U.S. Cl. .......................... 327/108; 327/437; 327/319; 326/30; 326/82
[58] Field of Search ................................. 327/108, 391, 327/437, 427, 309, 319, 112; 326/30, 82

[56] References Cited

U.S. PATENT DOCUMENTS

| | | | |
|---|---|---|---|
| 4,719,369 | 1/1988 | Assano et al. | 326/30 |
| 5,134,311 | 7/1992 | Biber et al. | 327/108 |
| 5,162,672 | 11/1992 | McMahan et al. | 326/30 |
| 5,306,965 | 4/1994 | Asprey | 326/83 |
| 5,581,197 | 12/1996 | Motley et al. | 326/30 |
| 5,602,494 | 2/1997 | Sundstrom | 326/30 |

FOREIGN PATENT DOCUMENTS

| | | | |
|---|---|---|---|
| 0463316 A1 | 1/1992 | European Pat. Off. | H04L 12/40 |
| 0639912 A1 | 2/1995 | European Pat. Off. | H04L 25/08 |

*Primary Examiner*—Dinh T. Le

[57] ABSTRACT

The present invention is generally directed to a PVT compensated variable impedance output driver for driving a signal through a signal pad on a semiconductor device. In accordance with one aspect of the present invention, the output driver includes a plurality of p-channel field effect transistors (PFETs) electrically connected in parallel. A source node of each of the plurality of PFETs are electrically connected together, and a drain node of each of the plurality of PFETs are electrically connected together. The driver further includes a plurality of n-channel field effect transistors (NFETs) electrically connected in parallel. A source node of each of the plurality of NFETs are electrically connected together and a drain node of each of the plurality of NFETs are electrically connected together. Further, the drain nodes of the plurality of PFETs are electrically connected with the source nodes of each of the plurality of NFETs, and are further electrically coupled (preferably through an ESD resistor) to the signal pad. A first PFET of the plurality of PFETs has a gate node that is driven by an output of a pull-up predriver circuit and a first NFET of the plurality of NFETs has a gate node that is driven by an output of a pull-down predriver circuit. The remaining PFETs and NFETs, however, have gate nodes that are driven by signals from the pull-up and pull-down predeiver circuits, as controlled by calibration words generated by a control circuit. In accordance with yet another aspect of the present invention, a method is provided for controllably varying the output impedance of an output driver circuit that is configured to drive a signal through a signal pad on a semiconductor device.

16 Claims, 4 Drawing Sheets

DIGITALLY CONTROLLED OUTPUT DRIVER AND METHOD FOR IMPEDANCE MATCHING

CROSS-REFERENCE TO RELATED APPLICATIONS

Not Applicable.

STATEMENT REGARDING FEDERALLY SPONSORED RESEARCH OR DEVELOPMENT

Not Applicable.

TECHNICAL FIELD

The present invention is generally related to driver circuits for high-speed semiconductor devices and, more particularly, is related to a driver circuit for high-speed semiconductor devices having variable output impedance.

BACKGROUND OF THE INVENTION

Modern integrated circuits commonly come in the form of chips. The integrated circuits within a chip communicate with the world outside the chip through metalization layers on the outside of the chip known as signal pads. For communication from within the chip to the world outside, "driver circuits" drive signals or data through the signal pads on the exterior of the chip. The signal pads of various chips are connected together by signal lines thereby allowing communications between different chips.

The signal pads on a chip are then connected to the packaging of the chip which is then connected to a signal trace on a printed circuit board which runs to another integrated circuit chip or other similar device. The electrical connection from the signal pad through the packaging of the chip to the transmission line contains parasitic resistance, inductance, and capacitance which interferes with the transmission of the signal from the signal pad. The printed circuit board signal trace itself also contains transmission line characteristics which include resistance, capacitance, and inductance which also interfere with the quality of the transmitters of the signal from the signal pad. All of the foregoing add to the load which must be driven by the driver circuit.

Because of the parasitic resistance, inductance, and capacitance which is present on chip to chip signal interconnections, the driver circuits that drive those signal interconnections are preferably designed to avoid excessive voltage swings when switching occurs (particularly for high speed or low power I/O). Excessive voltage swings are known as ringing. Ringing must be avoided while still switching as fast as possible to meet the high speed performance requirements of modern integrated circuits.

In the past, CMOS drivers have utilized NMOS (and/or PMOS) FET's to drive the signal pad to a voltage level based on a clocked or static input to the driver input. The drive NMOS FET's are turned on or off based on the inputs from inside the chip and stay in that state, regardless of the state of the transmission line being driven.

Due to process variations inherent in the manufacturing process of integrated circuits, different integrated circuits intended to perform the same function can be classified as "slow", "nominal," or "fast". During the manufacturing process for integrated circuits, variations in certain parameters occur. For example, the doping level, the length of channels in FET's, the thickness of the gate oxide for transistors, the diffusion resistance and other characteristics of integrated circuits vary during the manufacturing process. In other words, two supposedly identical integrated circuits can vary in all of those characteristics. As those characteristics approach the fast case, the resistance of many components within a chip is decreased. In the opposite extreme, as those characteristics stray further and further from the ideal case, the performance of the chip is degraded, specifically, the resistance of the many components within the chip is increased, and that situation will be referred to as the slow case.

Also, variations in voltage and temperature can cause a single chip to behave as if it is fast or slow. For example, when the temperature of an integrated circuit approaches its maximum operating temperature, the resistance of FET's in the integrated circuit increases. It is desirable to have a single driver circuit which can operate effectively and still avoid excessive voltage swings regardless of whether the integrated circuit is fast or slow.

In prior systems the size of the FET's driving the signal interconnects have been limited in size in order to minimize excessive voltage overshoot and undershoot when the process parameters are such that the NMOS FET's own impedance is at a minimum and the interconnects impedance is at its maximum. However, this approach has limited the speed of switching when variations in the process parameters have moved these impedances to the opposite case.

This approach has caused an additional problem in system timing. It has increased the uncertainty of placement of the switching transition in time. This has limited the system frequency and causes a degradation in performance.

Figure 1:
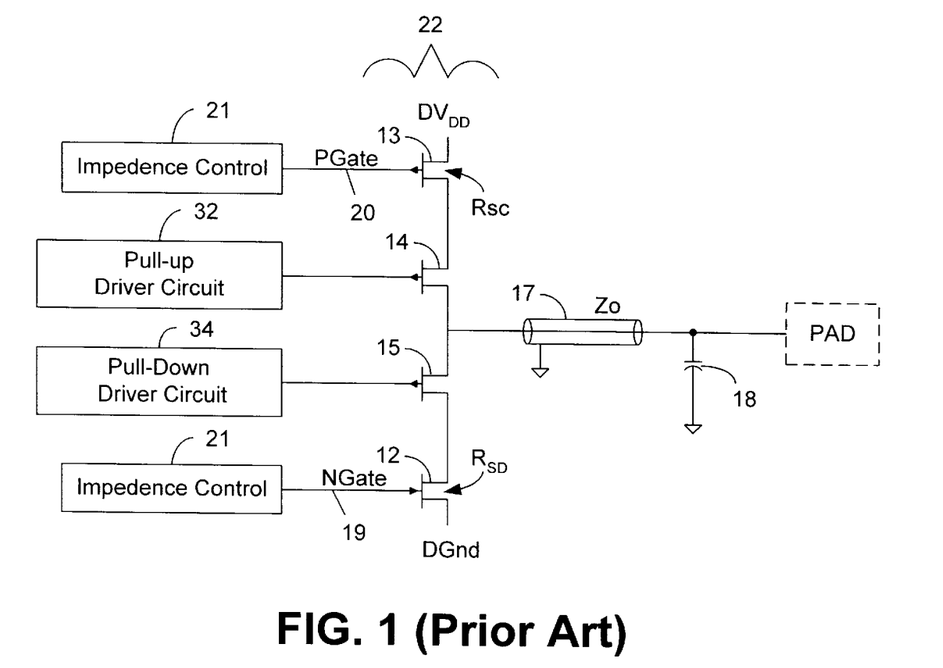
FIG. 1 is a schematic diagram of a driver circuit having a variable output impedance, as is known in the prior art.

One approach known in the prior art to address this problem is to provide a programmable output driver stage in a CMOS output driver. One such circuit is illustrated in FIG. 1. The figure shows programmable current sources 21 (which serves to control the impedance of FETs 12 and 13) and two output driver stage 22. The CMOS output stage 22 drives a capacitively terminated transmission line 17. The transmission line has a characteristic impedance of Zo. Programmable current source 21 determines a composite source impedance for the CMOS output driver stage. That composite source impedance can be separated into a value Rsc (the source resistance while charging) and a value Rsd (the source resistance while discharging). Generally speaking, it is desirable that Rsc and Rsd be equal to each other and to the characteristic impedance Zo of the transmission line 17, although one can imagine that there might be special circumstances that would require them to be different.

Note the capacitive load 18 at the other end of transmission line 17. The system may employ a well understood technique of doubling the output voltage by using reflected power from the reactive (and non power dissipative) discontinuity (capacitive load 18) at the terminus of the transmission line 17. It is the desire to achieve the full doubling, but without added overshoot (Zo too low plus the evil of multiple reflections) or excessive rise time (Zo too high and the attendant multiple reflections), that leads to extra concern about the source impedance of the output driver stages 22 and 23. Note that when the load is reactive, the power that is launched by charging through Rsc is: transmitted out through Zo, reflected (and the voltage at the load is doubled); transmitted back through Zo; and is then absorbed by discharging, without re-reflection, by a still on Rsc. A similar sequence of events occurs for discharging involving Rsd. (All provided, of course, that Rsc=Zo=Rsd). Yet even in a situation where there is a resistive termination with the expectation of genuine power transfer to the load without reflection, it is still important to control the source impedance of the output driver stages.

To appreciate the operation of the CMOS device, consider output driver stage 22, which includes four CMOS devices 12, 13, 14, and 15 connected as shown. Devices 14 and 15 act as switches to respectively pull-up (charge to DVDD) and pull-down (discharge to DGND) on the output terminal 16 that drives the transmission line 17 whose Zo is to be matched by Rsc (during pull-up) and by Rsd (during pull-down). It will be understood that switching devices 14 and 15 are driven on and off in suitable alternation in accordance with the desired output waveform, and that although both devices 14 and 15 may be off to tri-state output terminal 16, both devices will never be on at the same time. In this regard, driver circuits 32 and 34 are provided to turn the switching devices 14 and 15 ON and OFF. Generally, and as is known, one driver circuit 32 operates to control the FET 14 to drive the output signal from a low to high value, while a second driver circuit 34 operates to control the FET 15 to drive the output signal from a high to low value.

Device 13 acts as a resistance of programmable value to combine with the very low on resistance of device 14 to produce Rsc. Similarly, device 12 acts as a resistance of programmable value to combine with the relatively low on resistance of device 15 to produce Rsd. The resistance of device 13 is controlled by the value of the voltage PGATE 20, while in similar fashion the resistance of device 12 is determined by the value of the voltage NGATE 19. Assuming now that the P-type device 13 and N-type device 12 have generally equal transconductance, the signals NGATE 19 and PGATE 20 are controlled such that they (1) can be externally varied to adjust Rsc and Rsd over a suitably wide range of Zo despite process variations; (2) vary together such that as NGATE increases from DGND toward DVDD, PGATE decreases correspondingly from DVDD toward DGND; and (3) automatically adjust to compensate for the effects of temperature. One manner and circuit for achieving these objectives is described in U.S. Pat. No. 5,581,197, assigned to the assignee of the present invention, and is hereby incorporated by reference in its entirety. While the circuitry described above effectively varies the output impedance over process and temperature variations, it has been found that the performance of the circuit can be significantly (adversely) affected by even relatively small amounts of noise. Accordingly, it is desirable to provide an improved output driver stage that effectively varies its output impedance over process, voltage, and temperature (PVT), and is less susceptible to the adverse effects of noise. More particularly, it is desirable to provide an improved output driver stage that can effectively vary its output impedance to precisely match board trace impedance, as that impedance changes over process, temperature, and voltage.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to a variable impedance output driver for driving a signal through a signal pad on a semiconductor device. In accordance with one aspect of the present invention, the output driver includes a plurality of p-channel field effect transistors (PFETs) electrically connected in parallel. A source node of each of the plurality of PFETs are electrically connected together, and a drain node of each of the plurality of PFETs are electrically connected together. The driver further includes a plurality of n-channel field effect transistors (NFETs) electrically connected in parallel. A source node of each of the plurality of NFETs are electrically connected together and a drain node of each of the plurality of NFETs are electrically connected together. Further, the drain nodes of the plurality of PFETs are electrically connected with the source nodes of each of the plurality of NFETs, and are further electrically coupled (preferably through an ESD resistor) to the signal pad. A first PFET of the plurality of PFETs has a gate node that is driven by an output of a pull-up predriver circuit and a first NFET of the plurality of NFETs has a gate node that is driven by an output of a pull-down predriver circuit. The remaining PFETs and NFETs, however, have gate nodes that are driven by the predriver pull-up and the predriver pull-down circuit as controlled by calibration words output from a control circuit.

In accordance with the novel aspect of the present invention, the PFETs and NFETs are controlled to selectively turn on and off various selected ones of the PFETs and NFETs to controllably vary the effective output impedance of the driver circuit. To facilitate this feature, the channel widths of the plurality of PFETs are variably sized. Preferably the channel widths are sized to have width dimensions that progressively vary by a factor of 2. Preferably, a total of eight PFETs and eight NFETs are provided (although other numbers of PFETs and NFETs may be used), so that a single digital control byte may be used to control the output impedance of the circuit. Preferably, the PFETs and NFETs are controlled so that the output impedance is substantially constant over a wide range of process, voltage, and temperature (PVT) conditions.

In accordance with another aspect of the present invention, a variable impedance output driver is provided for driving a signal through a signal pad on a semiconductor device. The driver includes a pull-up predriver circuit configured to drive an output signal to the signal pad from a low state to a high state, and a pull-down predriver circuit configured to drive an output signal to the signal pad from a high state to a low state. In addition, the driver circuit includes a field effect transistor (FET) network interposed between the signal pad and both the pull-up predriver circuit and the pull-down predriver circuit. Finally, the driver circuit includes an impedance control circuit having a plurality of output signals that are input to the FET network, whereby the impedance control circuit output signals serve to controllably vary the output impedance of the output driver.

In accordance with yet another aspect of the present invention, a method is provided for controllably varying the output impedance of an output driver circuit that is configured to drive a signal through a signal pad on a semiconductor device. In accordance with this aspect, the method comprising the steps of providing a plurality of p-channel field effect transistors (PFETs) electrically connected in parallel across the output of a pull-up FET, and providing a plurality of n-channel field effect transistors (NETs) electrically connected in parallel across the output of a pull-down FET, wherein a drain node of the pull-up FET is electrically connected to source node of the pull-down FET, and wherein the source node of the pull-down FET is electrically coupled to the signal pad. The method further includes the step of providing a plurality of electrical signals to gate nodes of the plurality of PFETs and NFETs, whereby the collective state of the plurality of electrical signals controllably varies the output impedance of the output driver.

Although the present invention has numerous advantages, a principal advantage of the invention is that it provides a substantially constant and precise output resistance over a wide PVT range. Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Having summarized the invention above, reference will now be made in detail to the description of the invention as illustrated by the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Figure 2:
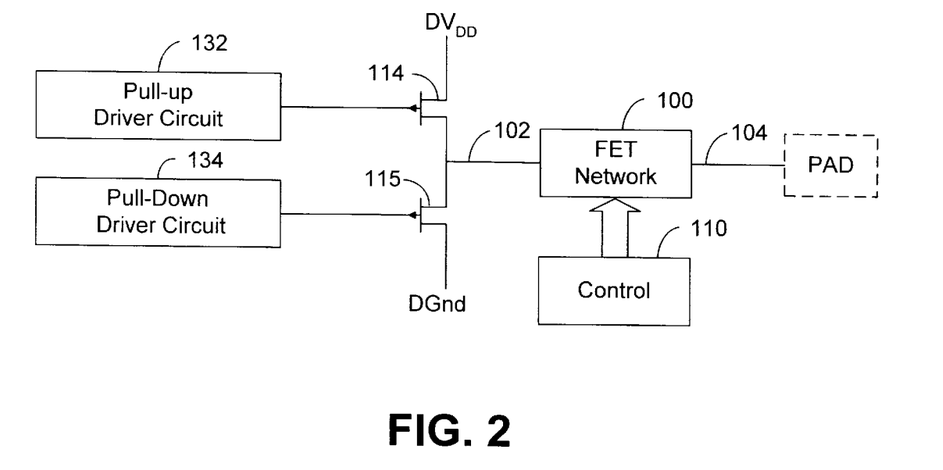
FIG. 2 is a block diagram illustrating one embodiment of a driver circuit having digitally controlled variable output impedance.

Turning now to the drawings, reference is made to FIG. 2, which is a block diagram illustrating a driver circuit having a controllably variable output impedance, and which improves on that of the prior art shown in FIG. 1. More specifically, the driver circuit includes a pull-up predriver circuit 132 and a pull-down predriver circuit 134. As is known, the pull-up predriver circuitry operates to drive an output value from a low state to a high state (e.g., logic zero to logic one), and the pull-down predriver circuit 134 operates to drive an output value from a high state to a low state. NFETs 114 and 115 are driven by the output of the pull-up predriver circuit 132 and the pull-down predriver circuit 134, respectively. The driver circuit output is that value seen on line 102, which is the electrical connection point between the drain node of NFET 114 and the source node of NFET 115. As will be further described in connection with FIG. 3, a FET network 100 is interposed between the signal line 102 and the driver pad. The FET network 100 provides a controllably variable impedance, which serves to vary the output impedance of the driver circuit to match the board trace impedance. The impedance provided by the FET network 100 is controlled by control circuit 110. The output of the FET network is routed to the driver pad via conductor 104.

Figure 3:
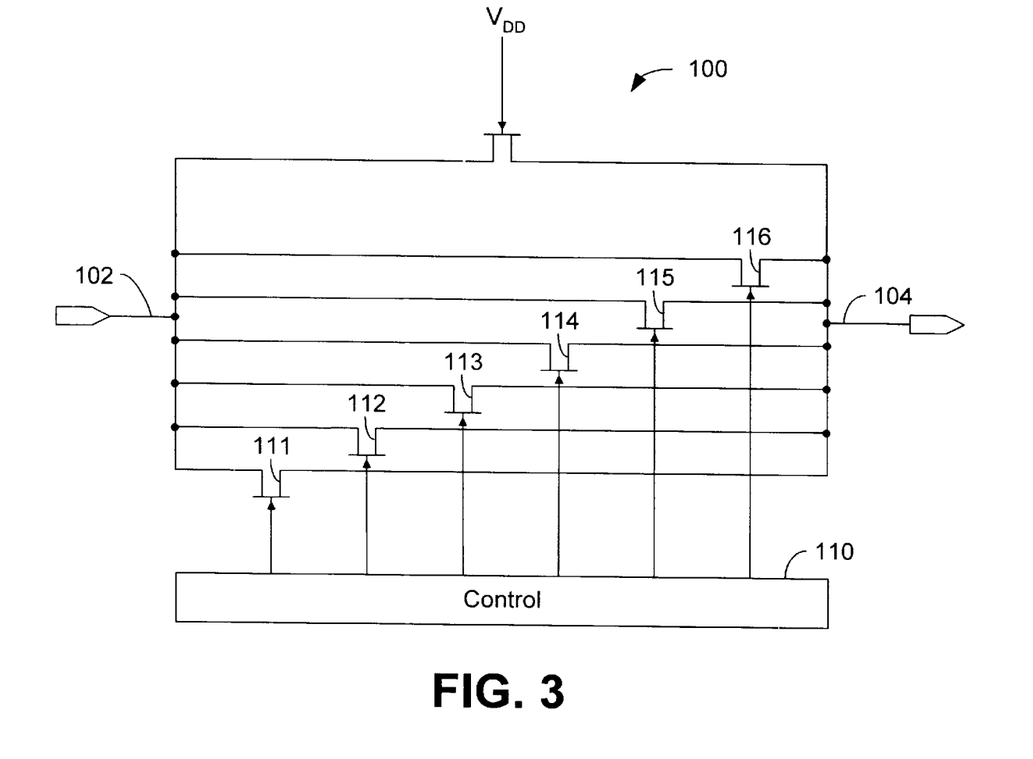
FIG. 3 is a schematic diagram of a portion of the block diagram of FIG. 2.

To more particularly described the structure and operation of the FET network 100, reference is now made to FIG. 3, which illustrates this circuitry in more detail. Specifically, the FET network 100 is shown in relation to the signal line 102, 104, and control circuit 110. The FET network includes a plurality of NFET devices 111, 112, 113, 114, 115, and 116 electrically connected in parallel. Each of the NFETs 111–116 is defined by a channel width that defines the conductance (and therefore resistance) of that NFET device. When turned on, each NFET passes the voltage from line 102 to line 104. When more than one of the NFET devices 111–116 is turned on, they act like resistors, combining in parallel to provide a lower resistance. In this way, the output impedance of the driver circuit is varied. Preferably, the NFET devices 111–116 are designed to have progressively decreasing channel widths, and specifically channel widths that decrease by a factor of two. Thus, for example, the channel width of NFET 111 may be some value X, the channel width of NFET 112 may be approximately ½ X, the channel width of NFET 113 approximately ¼ X, and so on. Therefore, the collective output of the control block 110 may serve as a digital control word to turn on selected ones of the NFET devices 111–116 to precisely control the output impedance of the driver circuit. It will be appreciated that the circuitry or logic of the control block 110 will be dependent upon process, voltage, and temperature (PVT), but need not be described herein. The FET network 100 is designed such that at least one path is always on to permit a signal to pass from signal line 102 to signal line 104, and therefore the signal path.

While the circuitry of FIGS. 2 and 3 provide an effective way to controllably vary the output impedance of a driver circuit, it nevertheless suffers from several shortcomings. First, proper operation of the circuitry assumes that the driver supply voltage is at least two times the turn on voltage for the NFETs. If not, proper operation will not occur. In addition, in environments where core logic levels equal the Driver Supply Voltage (DVDD), the signal value at line 102 (FIG. 2) is actually less than the logic high output, due to the voltage drop equal to the sum of the turn on voltages across the FET devices 114 and 115. Accordingly, an alternative solution is desired.

Figure 4:
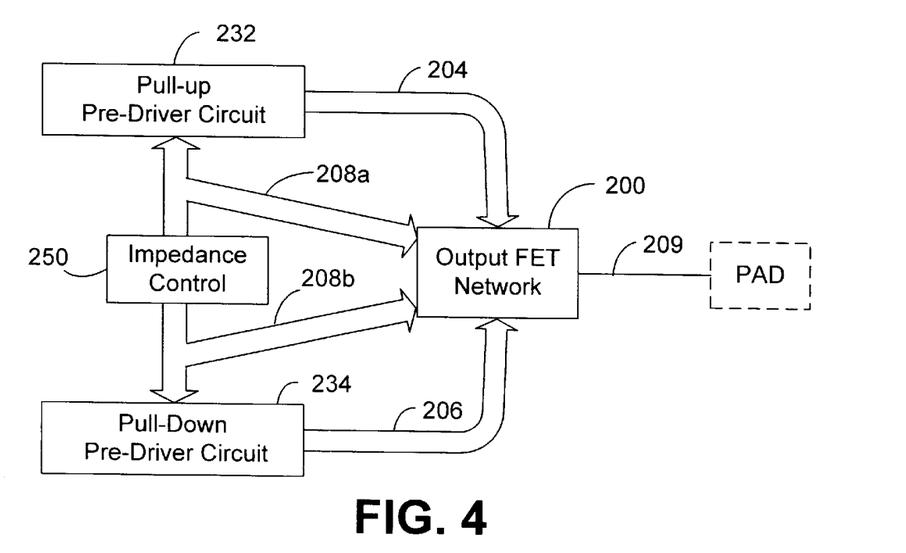
FIG. 4 is a block diagram illustrating a driver circuit having digitally controlled variable output impedance, constructed in accordance with the present invention.

Reference is now made to FIG. 4, which is a block diagram illustrating the driver circuit of the present invention. Like circuits of the prior art systems, the driver circuit of the present invention operates in a driver circuit environment having a pull-up predriver circuit 232 and a pull-down predriver circuit 234. These circuits operate to driver an output signal from a low state to a high state and from a high state to a low state (or to a tri-state), respectfully. The outputs 204 and 206 of circuits 232 and 234 are directed to an output FET network 200, which is constructed in accordance wit the present invention. As illustrated in FIG. 4, the output 209 of the output FET network 200 is directed to the signal pad. Also, an impedance control circuit 250 generates control signals 208a and 208b in the form of calibration words, which are used to control the operation of the output FET network 200, in a manner as will be described below.

Figure 5:
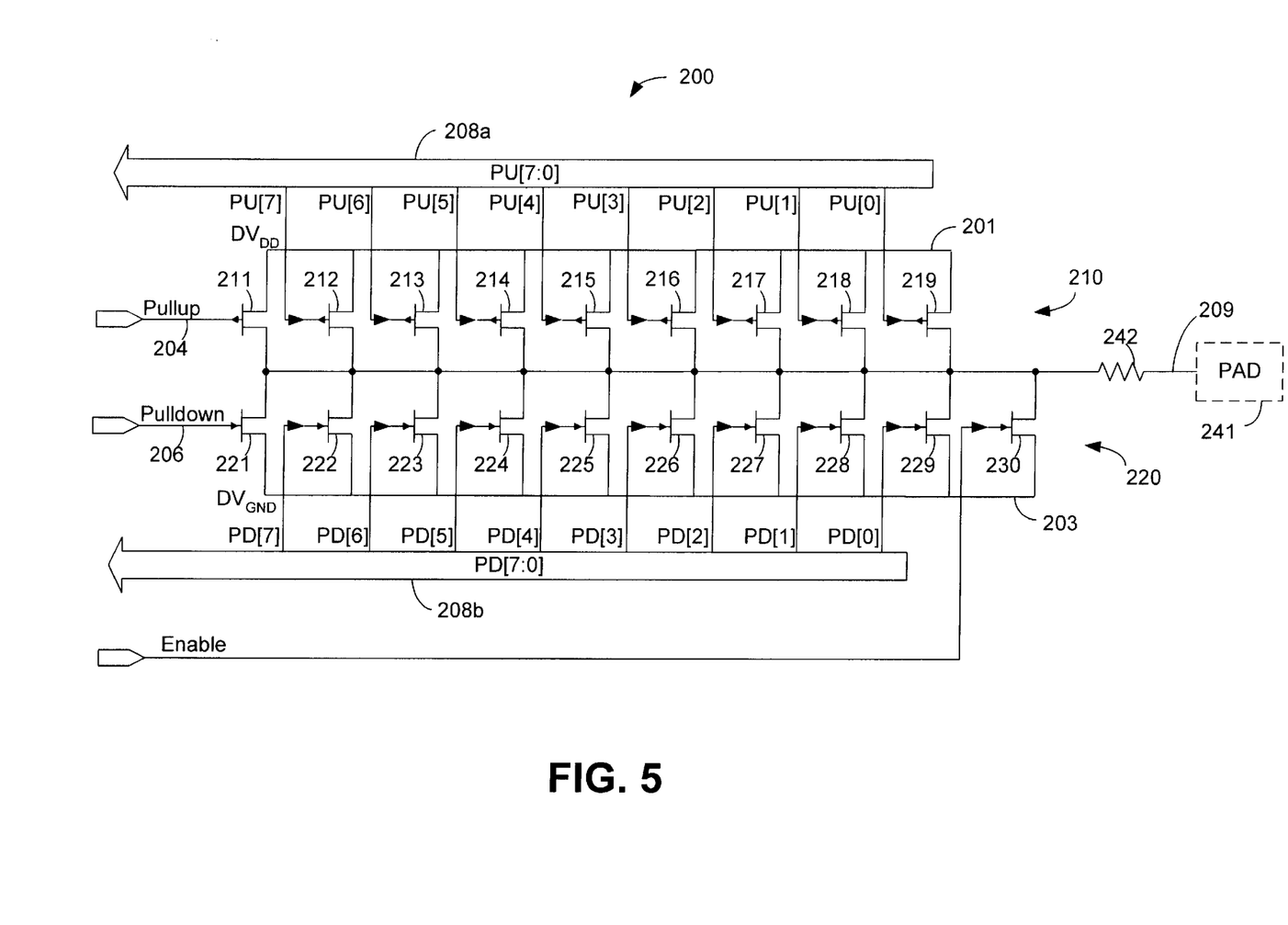
FIG. 5 is a schematic diagram of the FET network portion of the block diagram of FIG. 4.

Having listed the broad circuit blocks of an output driver circuit constructed in accordance with the invention, reference is now made to FIG. 5 which illustrates, in detail, the preferred embodiment of the output FET network 200 constructed in accordance with the present invention. In short, the FET network 200 includes an array of PFETS 210 which are electrically connected in parallel, such that the source node of each PFET is electrically connected with other source nodes and the drain node of each PFET is electrically connected with other drain nodes. The network 200 further includes an array of N-channel field effect transistors (NFETs) 220, electrically connected such that the source nodes are electrically connected together and further connected to the drain nodes of the array of PFETS 210, and the drain nodes are electrically connected together.

In accordance with the preferred embodiment, the PFET array 210 includes nine PFET devices 211, 212, 213, 214, 215, 216, 217, 218, and 219. The source nodes of each of these PFET devices are electrically connected together on a common signal line 201 which is at a potential DVDD. In similar fashion, the array 220 of NFET devices includes nine NFET devices 221, 222, 223, 224, 225, 226, 227, 228, and 229. In additional NFET device 230 may be provided at the output to lightly pull down an otherwise undriven output so that it does not float (as floating inputs are undesirable in CMOS devices). The drain nodes of each of the plurality of NFET devices are electrically connected together at line 203, which is at the potential DGND, The PFET array 210 includes a first PFET 211 that is driven directly by the output 204 of the pull-up predriver circuit 232. Similarly, the NFET array 220 includes a first NFET device 221 that is driven by the output 206 of the pull-down predriver circuit 234. The remainder of the PFETS and NFETS in the two arrays are driven by control signals that are provided on busses 208a and 208b, designated by the label PU[7:0] and PD[7:0]. As will be illustrated and described in connection with FIG. 6, the control signals provided on lines 208a and 208b generate digital control words that are used to selectively turn on and off the various PFET and NFET devices of the arrays 210 and 220 to effectively vary the output impedance of the driver circuit.

In accordance with the preferred embodiment, the channel widths of each of the PFETs and NFETs in the two arrays are designed to progressively decrease by a factor of two in order to provide effective binary weighting of their values. Thus, for example, if the channel width of PFET 212 is X and PFET 212 has a conductance G, then if the channel width of PFET 213 is one-half X, then PFET 213 will have a conductance of 0.5·G Accordingly, Table 1 is provided below which specifies the physical size (as drawn) of the various transistors illustrated in FIG. 5, in accordance with the preferred embodiment of the present invention. It should be appreciated, however, that the invention is mot limited to the values set forth in the table, but that the table is provided merely to fully disclose the preferred embodiment of the present invention.

TABLE 1

| Reference Numeral | Length (microns) | Width (microns) |
| --- | --- | --- |
| 211 | .44 | 80 |
| 212 | .44 | 160 |
| 213 | .44 | 80 |

TABLE 1-continued

| Reference Numeral | Length (microns) | Width (microns) |
| --- | --- | --- |
| 214 | .44 | 40 |
| 215 | .44 | 20 |
| 216 | .44 | 10 |
| 217 | .44 | 5 |
| 218 | .44 | 2.5 |
| 219 | .44 | 1.25 |
| 220 | .44 | 32 |
| 221 | .44 | 64 |
| 222 | .44 | 32 |
| 223 | .44 | 16 |
| 224 | .44 | 8 |
| 225 | .44 | 4 |
| 226 | .44 | 2 |
| 227 | .44 | 1 |
| 228 | .44 | .5 |
| 229 | 1 | 1 |

Consistent with the concepts and teachings of the present invention, the control circuitry 250 (FIG. 4) may be implemented in a variety of ways. What is important for purposes of the inventive concepts is that the control circuit 250 controls the state of the various PFETs in the FET array 200 to vary the output impedance of the driver circuits so that the output resistance remains substantially constant over all ranges of the process, votage, and temperature. Various structures and circuits may be implemented to achive this broad goal, and FIG. 6 illustrates just one such circuit.

Figure 6:
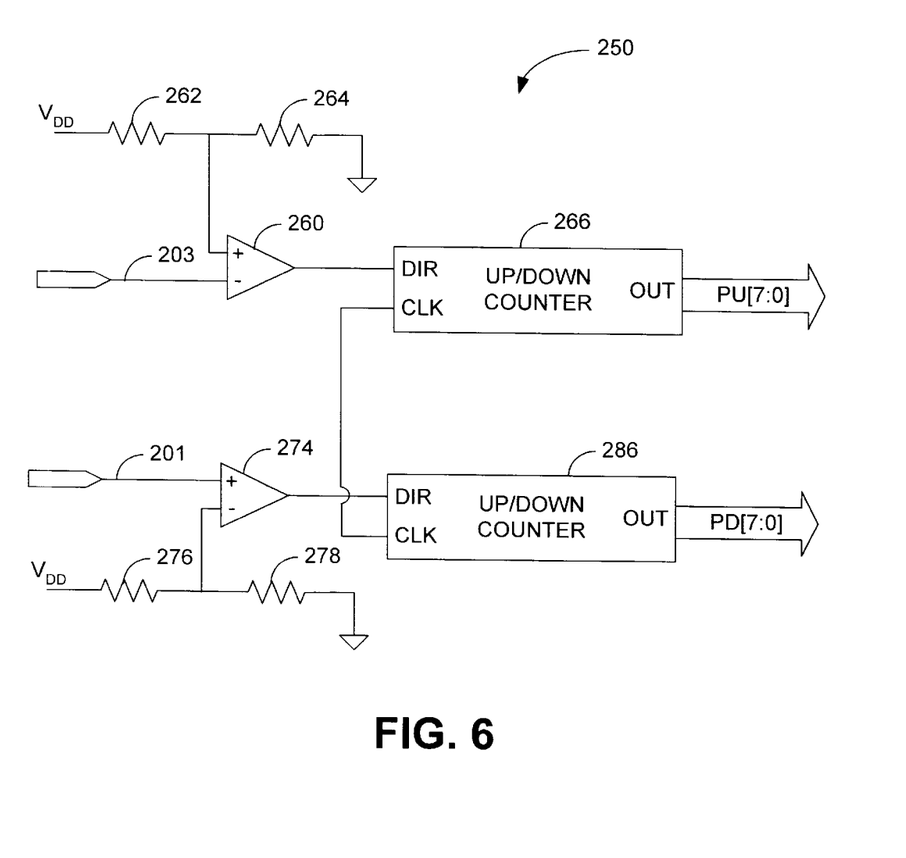
FIG. 6 is a schematic diagram of a portion of a possible impedance control circuit illustrated in the block diagram of FIG. 4.

Referring mow to FIG. 6, two sets of control signals are produced (one for the pull-up transistors, one for the pull-down transistors) that can be used to program a group of output driver's impedances to match, or be some multiple of an external resistor. During normal operation, a calibration driver PFET array 210 has current flowing through it. Each transistor of PFET array 210 is nominally equivalent in size of each transistor in the pull-up PFET array on a digitally controlled output driver. Current flows from positive supply DVDD (which may be clean or dirty) through PFET array 210, through electrostatic discharge (ESD) protection resistor 242, out pad 241, through external resistor (not shown) to ground.

The impedances of the PFET array 210 and the ESD protection resistor 241 form a voltage divider with external resistor to divide down the positive supply voltage at the pad 241 node. This node is an input to the inverting terminal of analog comparator 260. The non-inverting input of analog comparator 260 is connected to a voltage divider formed with resistors 262 and 264. Resistors 262 and 264 may be on-chip resistors and are connected in series between the positive supply and the negative supply with the intermediate node connected to the non-inverting input of analog comparator 260. In one embodiment, resistors 262 and 264 have the same value so that the voltage at the non-inverting input of analog comparator 260 is VDD/2. The output of analog comparator 260 is connected to the DIR input of digital up/down counter 266 which controls the direction that up/down counter 266 counts. Up/down counter 266 may be a saturating counter so that it does not roll over from its highest output to the lowest and visa-versa. Up/Down counter 266 increments or decrements the binary value on its outputs according to the state of DIR when the clock input, CLK, is strobes. The outputs of up/down counter 266 generate signals PU[7:0], each of which is used to controuenable the predriver circuit to drive the gate of one of the transistors of PFET array 210. In a preferred embodiment, and as previously mentioned, the sizes of each transistor in PFET array 210 are scaled to correspond to the significance of the bit of PU[7:0] connected to its gate. For example, if P[N] controls a FET with conductance G, then P[N+1] controls a FET with conductance 2G.

Up/down counter 266 counts down when the inverting input of comparator 260 is higher than the non-inverting input of analog comparator 260. This turns off more of the transistors of PFET array 210 increasing the impedance of PFET array 210. When the inverting input of comparator 260 is lower than the non-inverting input of analog comparator 260, up/down counter 266 counts up turning on more of the transistors of PFET array 210 decreasing the impedance of PFET array 210. This feedback system stabilizes when the impedance of PFET array 210 and ESD protection resistor 242 nearly matches the resistance of external resistor.

The inputs to analog comparator 274 are generated in a similar fashion to the inputs of comparator 260. The output of analog comparator 274 is connected to the DIR input of up/down counter 286. The output signals of up/down counter 286 are connected to signals PD[7:0]. These signals are used to control/enable the predriver circuit to drive the gates of the transistors of NFET array 220. When the inverting input of comparator 274 is lower than the non-inverting input of analog comparator 274, up/down counter 286 counts down turning off more of the transistors of NFET array 220 increasing the impedance of NFET array 220. When the inverting input of comparator 274 is higher than the non-inverting input of analog comparator 274, up/down counter 286 counts up turning on more of the transistors of NFET array 220 decreasing the impedance of NFET array 130.

Again, and as previously mentioned, the circuit of FIG. 6 is provided merely as illustrative of how the control inputs for the FET array 200 may be generated. The particular manner of generation of these signals does not form a limitation upon the invention, and therefore need not be described in any further detail herein. It will be appreciated, however, that the circuit of FIG. 6 allows the system to continuously update (via the comparators and up-down counters) the calibration control words, and therefore the output impedance of the output driver.

More generally, the calibration circuitry of FIG. 6 is designed to program all output driver's PFET impedances to match that of, or be a multiple of, an external precision resistor. During normal operation, a PFET array equivalent in size to a data or clock output driver has current flowing through it. The current flows through the I/O pad 241, on board to an external resistor connected to GND. This current path forms a voltage divider, where the two resistances are the driver's output resistance and the external resistor. The pad serves as an input 203 to a terminal of the differential amplifier 260. The other terminal of amplifier 260 is VDD/2. Any difference between input voltages to the differential amplifier is perceived as a resistance mismatch between the driver's output resistance and the external resistor. The delta voltage causes the differential amplifier's output to program an up/down counter 266 to increment/decrement its output. Upon receiving a clock edge, the up/down counter drives a new binary count, PU[n:0] (for an n bit counter). This calibration word is used by the calibration circuitry's pull up driver and distributed to other drivers. Incremental binary changes in PU[n:0] cause incremental resistance changes in the calibration driver. Because the calibration driver has a new calibration word, the calibration driver has a new output resistance. It will be appreciated that the calibration process is continuous and transparent to normal chip operation.

The calibration circuitry of FIG. 6 is also designed to program all output driver's NFET impedances to match that or be a multiple of an external precision resistor. During normal operation, a NFET array equivalent in size to a data or clock output driver has current flowing through it. The current flows through the I/O pad (241), on board to an external resistor connected to VDD. This current path forms a voltage divider between the driver's output resistance and the external resistor. The pad serves as an input 201 to a terminal of the differential amplifier 274. The other terminal of 274 is VDD/2. Any difference between input voltages to the differential amplifier is perceived as a resistance mismatch between the driver's output resistance and the external resistor. The delta voltage causes the differential amplifier's output to program an up/down counter 286 to increment/decrement its output. Upon receiving a clock edge, the up/down counter drives a new binary count, PU[n:0]. This calibration word is used by the calibration circuitry's pull down driver and distributed to other drivers. Incremental binary changes in PD[n:0] cause incremental resistance changes in the calibration driver. Because the calibration driver has a new calibration word, the calibration driver has a new output resistance. The calibration process is continuous and transparent to normal chip operation.

The foregoing description has been presented for purposes of illustration and description. It is not intended to be exhaustive or to limit the invention to the precise forms disclosed. Obvious modifications or variations are possible in light of the above teachings. For example, it will be appreciated that the calibration words 208a and 208b (illustrated herein as eight bit words) may be of differing size, either fewer or greater than eight bits.

The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A variable impedance output driver for driving a signal through a signal pad on a semiconductor device, the output driver comprising:

a plurality of p-channel field effect transistors (PFETs) electrically connected in parallel, wherein a source node of each of the plurality of PFETs are electrically connected together and a drain node of each of the plurality of PFETs are electrically connected together; and a plurality of n-channel field effect transistors (NFETs) electrically connected in parallel, wherein a source node of each of the plurality of NFETs are electrically connected together and a drain node of each of the plurality of NFETs are electrically connected together, and wherein the drain nodes of each of the plurality of PFETs is electrically connected with the source nodes of each of the plurality of NFETs and is further electrically coupled to the signal pad;

wherein a first PFET of the plurality of PFETs has a gate node that is driven by an output of a pull-up predriver circuit and a first NFET of the plurality of NFETs has a gate node that is driven by an output of a pull-down predriver circuit, and wherein each of the remaining PFETs and NFETs have gate nodes and the pull-up and pull-down predriver circuits are driven by a calibration word generated by a control circuit.

2. The driver of claim 1, wherein the plurality of PFETs are variably sized.

3. The driver of claim 2, wherein the plurality of PFETs, excluding the first PFET, are sized to have progressively smaller width dimensions.

4. The driver of claim 2, wherein the plurality of PFETs, excluding the first PFET, are sized to have width dimensions that progressively vary by a factor of 2.

5. The driver of claim 1, wherein the plurality of NFETs are variably sized.

6. The driver of claim 5, wherein the plurality of NFETs, excluding the first NFET, are sized to have progressively smaller width dimensions.

7. The driver of claim 6, wherein the plurality of NFETs, excluding the first NFET, are sized to have width dimensions that progressively vary by a factor of 2.

8. The driver of claim 1, further including a resister electrically disposed in series between the signal pad and the common connection of the drain nodes of the plurality of PFETS and the source nodes of the plurality of NFETS.

9. A variable impedance output driver for driving a signal through a signal pad on a semiconductor device, the output driver comprising:

a pull-up predriver circuit configured to drive an output signal to the signal pad from a low state to a high state;

a pull-down predriver circuit configured to drive an output signal to the signal pad from a high state to a low state;

a field effect transistor (FET) network interposed between the signal pad and both the pull-up predriver circuit and the pull-down predriver circuit; and an impedance control circut coupled to said pull-up predriver circuit, to said pull-down predriver circuit and to the field effect transistor network for generating a plurality of output signals to controllably vary the output impedance of the output driver.

10. The driver of claim 9, wherein the FET network includes a plurality of p-channel field effect transistors (PFETs) electrically connected in parallel, wherein a source node of each of the plurality of PFETs are electrically connected together and a drain node of each of the plurality of PFETs are electrically connected together.

11. The driver of claim 10, wherein the FET network includes a plurality of n-channel field effect transistors (NFETs) electrically connected in parallel, wherein a source node of each of the plurality of NFETs are electrically connected together and a drain node of each of the plurality of NFETs are electrically connected together.

12. The driver of claim 11, wherein the drain nodes of each of the plurality of PFETs is electrically connected with the source nodes of each of the plurality of NFETs and is further electrically coupled to the signal pad.

13. The driver of claim 10, wherein a first PFET of the plurality of PFETs has a gate node that is driven by an output of a pull-up predriver circuit.

14. The driver of claim 11, wherein a first NFET of the plurality of NFETs has a gate node that is driven by an output of a pull-down predriver circuit.

15. The driver of claim 12, wherein most of the plurality of PFETs and most of the plurality of NFETs have a gate node that is driven by one of the output signals of the impedance control circuit.

16. A method for controllably varying an output impedance of an output driver circuit that is configured to drive a signal through a signal pad on a semiconductor device, the method comprising the steps of:

providing a plurality of p-channel field effect transistors (PFETs) electrically connected in parallel across the output of a pull-up FET;

providing a plurality of n-channel field effect transistors (NFETs) electrically connected in parallel across the output of a pull-down FET, wherein a drain node of the pull-up FET is electrically connected to source node of the pull-down FET, and wherein the source node of the pull-down FET is electrically coupled to the signal pad;

driving a gate node of a first PFET with a pull-up predriver circuit and a gate node ofa first NFET with a pull-down predriver circuit; and providing a plurality of electrical signals, to the pull-up predriver circuit, to the pull-down predriver circuit, and to gate nodes of the remaining PFETs and gate nodes of the remaining NFETs whereby a collective state of the plurality of electrical signals controllably varies the output impedance of the output driver.

* * * * *